United States Patent
Gandhi

(10) Patent No.: US 10,886,196 B2
(45) Date of Patent: Jan. 5, 2021

(54) SEMICONDUCTOR DEVICES HAVING CONDUCTIVE VIAS AND METHODS OF FORMING THE SAME

(71) Applicant: Micron Technology, Inc., Boise, ID (US)

(72) Inventor: Jaspreet S. Gandhi, Union City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/371,635

(22) Filed: Apr. 1, 2019

(65) Prior Publication Data

US 2019/0229039 A1    Jul. 25, 2019

Related U.S. Application Data

(62) Division of application No. 14/667,924, filed on Mar. 25, 2015, now abandoned.

(51) Int. Cl.
| | |
|---|---|
| *H01L 21/768* | (2006.01) |
| *H01L 23/48* | (2006.01) |
| *H01L 23/532* | (2006.01) |
| *H01L 23/36* | (2006.01) |
| *H01L 23/42* | (2006.01) |
| *H01L 23/498* | (2006.01) |

(52) U.S. Cl.
CPC ...... *H01L 23/481* (2013.01); *H01L 21/76898* (2013.01); *H01L 23/53238* (2013.01); *H01L 23/36* (2013.01); *H01L 23/42* (2013.01); *H01L 23/49816* (2013.01); *H01L 23/49827* (2013.01); *H01L 2224/16145* (2013.01); *H01L 2224/16225* (2013.01); *H01L 2224/32145* (2013.01); *H01L 2224/73204* (2013.01); *H01L 2924/15311* (2013.01); *H01L 2924/16195* (2013.01)

(58) Field of Classification Search
CPC .................................................. H01L 21/76898
USPC .......................................................... 438/667
See application file for complete search history.

(56) References Cited

U.S. PATENT DOCUMENTS

| | | | |
|---|---|---|---|
| 8,956,966 B2 | 2/2015 | Lin et al. | |
| 8,977,806 B1 | 3/2015 | Rosenband et al. | |
| 8,987,131 B2 | 3/2015 | Sakuma | |
| 2007/0080346 A1 | 4/2007 | Kim et al. | |
| 2014/0065842 A1* | 3/2014 | Anthis | H01L 21/0215 438/779 |
| 2015/0017798 A1 | 1/2015 | Zhang | |
| 2015/0035168 A1 | 2/2015 | Tezcan et al. | |
| 2015/0096798 A1 | 4/2015 | Uzoh | |
| 2016/0049371 A1 | 2/2016 | Lee et al. | |
| 2016/0155686 A1* | 6/2016 | Lee | H01L 24/92 257/737 |

* cited by examiner

*Primary Examiner* — Hsin Yi Hsieh

(74) *Attorney, Agent, or Firm* — Brooks, Cameron & Huebsch, PLLC

(57) ABSTRACT

Semiconductor devices having a conductive via and methods of forming the same are described herein. As an example, a semiconductor devices may include a conductive via formed in a substrate material, a barrier material, a first dielectric material on the barrier material, a coupling material formed on the substrate material and on at least a portion of the dielectric material, a second dielectric material formed on the coupling material, and an interconnect formed on the conductive via.

13 Claims, 8 Drawing Sheets

SEMICONDUCTOR DEVICES HAVING CONDUCTIVE VIAS AND METHODS OF FORMING THE SAME

PRIORITY INFORMATION

This application is a Divisional of U.S. application Ser. No. 14/667,924 filed on Mar. 25, 2015, the contents of which are incorporated herein by reference.

TECHNICAL FIELD

The present disclosure relates generally to semiconductor devices and methods, and more particularly to semiconductor devices having conductive vias and methods of forming the same.

BACKGROUND

Semiconductor devices can be used in a variety of electronic applications, such as personal computers, cell phones, digital cameras, and other electronic devices. Various semiconductor devices, e.g., memory dies, utilize conductive vias, e.g., through-silicon-vias (TSVs), which provide electrical continuity through a semiconductor device, such as a silicon wafer or die, for instance. TSVs can enable two or more integrated circuit (IC) devices to be stacked vertically into a three-dimensional (3D) chip stack. For example, the TSVs of an IC device at a top of a stack can connect to the TSVs of an IC device lower in the stack. By electrically connecting the IC devices in a stack, the TSVs can enable the IC devices in the stack to function as a single device, for example. TSV technology can enable a 3D chip stack to have increased connectivity, bandwidth, and/or functionality, yet occupy a small footprint area, among other benefits.

DETAILED DESCRIPTION

Figure 1A:
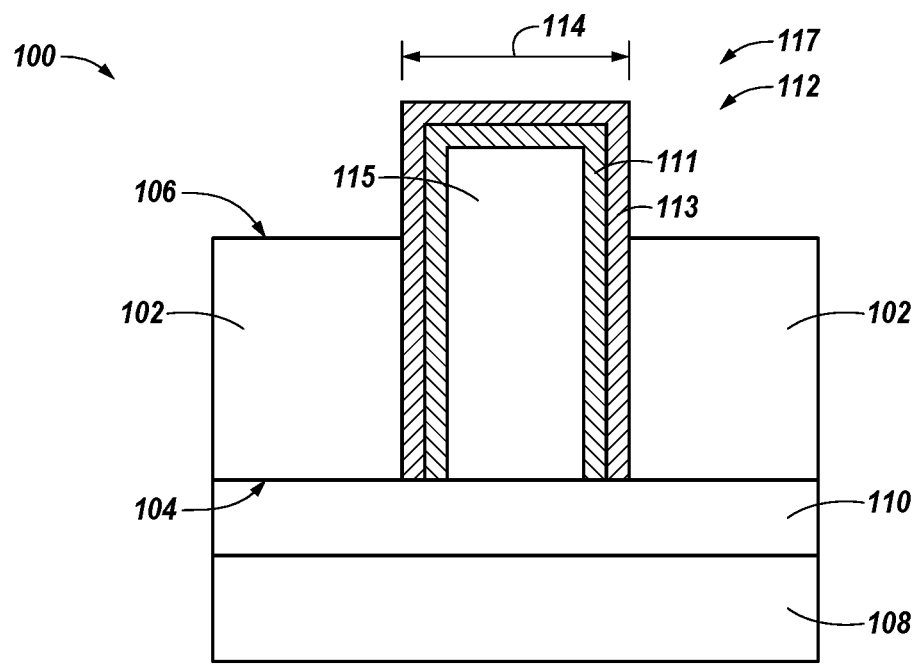
FIGS. 1A-1G illustrate various process stages associated with forming a semiconductor device in accordance with a number of embodiments of the present disclosure.

Semiconductor devices having a conductive via and methods of forming the same are described herein. For instance a semiconductor device can include a conductive via formed in a substrate material, where a portion of the conductive via extends from a surface of the substrate material, and where the portion of the conductive via extending from the surface of the substrate material includes a barrier material on a conductive core material and a first dielectric material on the barrier material, a coupling material formed on the substrate material and on at least a portion of the first dielectric material, a second dielectric material formed on the coupling material, and an interconnect formed on an exposed portion of the conductive core and on a portion of the second dielectric material. Various embodiments of the present disclosures provide that a semiconductor device can include a conductive via formed in a substrate material, where a portion of the conductive via extends from a surface of the substrate material, and where the portion of the conductive via extending from the surface of the substrate material includes a barrier material on a conductive core material and a first dielectric material on the barrier material, a coupling material formed on the substrate material and on at least a portion of the first dielectric material, a second dielectric material formed on the coupling material, and an interconnect formed on a portion of the barrier material and on a portion of the second dielectric material.

Conductive vias, such as TSVs, may be formed in semiconductor devices by a variety of processes. As an example, a photoresist can be applied to a surface, e.g., frontside surface of a semiconductor wafer. Thereafter, the wafer can be patterned and an etching process, such as a deep reactive-ion etching process, can be utilized to create vias in the patterned wafer. The wafer, which may be referred to as a substrate, can include a number of semiconductor based structures that can include silicon, silicon-on-insulator (SOI), silicon-on-sapphire, silicon germanium, gallium-arsenide, among others. For various applications, a number of materials may be formed in the vias. For instance, a liner material, which can include an oxide and a barrier material, such as a tantalum for instance, can be formed in the vias. The vias can be filled with a conductive material, such as copper, tungsten, or aluminum, for instance. At this stage the filled vias may not extend completely through the wafer. As such, the wafer can be flipped and backside processing can occur. For instance, a thinning and/or reveal process can be performed resulting in the conductive material within the vias extending all the way through the wafer.

After the reveal process, e.g., after the conductive vias extend through the wafer, a number of further processing steps can be performed for various applications. For example, previous wafer processing flows utilize processing stages that can include chemical vapor deposition (CVD) of layers, such as silicon nitride layers, subsequent etching of the silicon nitride layer, and/or chemical-mechanical planarization (CMP) of the wafer subsequent to a reveal process. The CVD, etching of the silicon nitride layer, and/or CMP stages can be time consuming and expensive. Among other benefits, a number of embodiments disclosed herein may be utilized to provide semiconductor devices in which CVD, etching of a silicon nitride layer, and/or CMP stages subsequent to a reveal process are not employed. As such, the semiconductor devices disclosed herein can be produced with an improved, e.g., reduced, cycle time and/or at a lower cost as compared to previous semiconductor devices, among other benefits.

Various embodiments discussed herein provide that after formation of the conductive vias, an interconnect, such as an under bump metallization (UBM) and/or a pillar, can be formed on a conductive via in order to facilitate connection, e.g., physical and/or electrical, of the semiconductor device to a number of other semiconductor devices and/or other components of an electronic device. After formation of the interconnect, a singulation process can occur, in which a wafer can be cut to form a number of singulated semiconductor devices, e.g., dies.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 112 may reference element "12" in FIG. 1, and a similar element may be referenced as 212 in FIG. 2. Also, as used herein, "a number of" a particular element and/or feature can refer to one or more of such elements and/or features.

FIGS. 1A-1G illustrate various process stages associated with forming a semiconductor device in accordance with a number of embodiments of the present disclosure. FIG. 1A illustrates a cross-sectional view of a portion of a semiconductor device 100 in accordance with a number of embodiments of the present disclosure.

The semiconductor device 100 shown in FIG. 1A includes a conductive via 112 formed in a substrate 102. In this example, a first face 104, e.g., front side, of the substrate 102 is adhered to a carrier wafer 108 via a temporary adhesive 110, e.g., a glue material. Although not shown in FIG. 1A, circuitry may be located between the adhesive 110 and coupled to the conductive via 112. The substrate 102 can include a semiconductor material, such as silicon, however, embodiments are not limited to a particular substrate material or materials. Additionally, although conductive vias, such as via 112, may be referred to herein as TSV's, the term TSV is not intended to limit embodiments to conductive vias formed in silicon.

As illustrated in FIG. 1A, the TSV 112 extends through the substrate 102, e.g., from the first face 104 to a second face 106, which can be referred to as a backside of the substrate 102. FIG. 1A illustrates device 100 subsequent to a reveal process in which a portion of the substrate material 102 has been removed, e.g., via an etch process, to expose a TSV protrusion 117. While FIG. 1A illustrates a single TSV 112, embodiments of the present disclosure are not so limited. For instance, the semiconductor device 100 can include a plurality of TSVs formed in substrate material 102 and arranged in an array configuration, for example.

In this example, the TSV 112 includes a liner material on a conductive core material 115. The liner material can include a number of materials. As an example, the liner material can include an outer dielectric material 113, e.g., an oxide barrier material such as SiO (silicon oxide), and an inner barrier material 111, e.g., Ta (tantalum). However, embodiments are not limited to a particular liner material(s). The core material 115 is a conductive material such as copper, tungsten, and aluminum, and/or combinations thereof, among various other conductive materials. The TSV 112 can provide a conductive path between opposing sides 104/106 of the semiconductor device 100. A diameter 114 of the TSV 112 can be in a range of about 3 microns to about 15 microns, for instance. However, embodiments of the present disclosure are not limited to TSVs having a particular diameter.

Figure 1B:
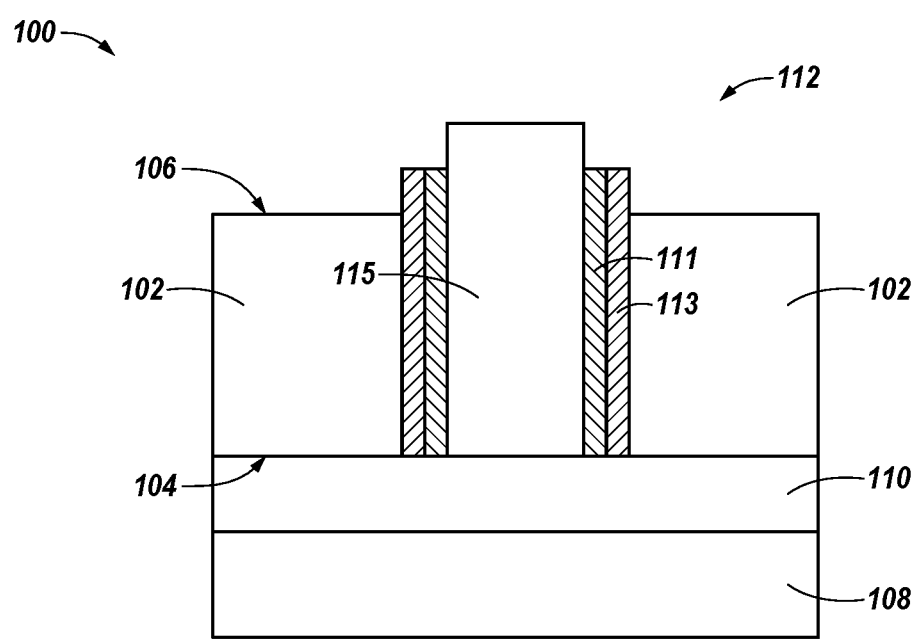

FIG. 1B illustrates the semiconductor device 100 of FIG. 1A at a subsequent processing stage. As illustrated in FIG. 1B, a portion of the dielectric material 113 and a portion of the barrier material 111 have been removed from the TSV 112 to expose a portion of the core material 115. Some embodiment of the present disclosure provide that the portion of the dielectric material 113 and the portion of the barrier material 111 can be removed in a same etch chamber, e.g., by utilizing different etch chemistries.

Figure 1C:
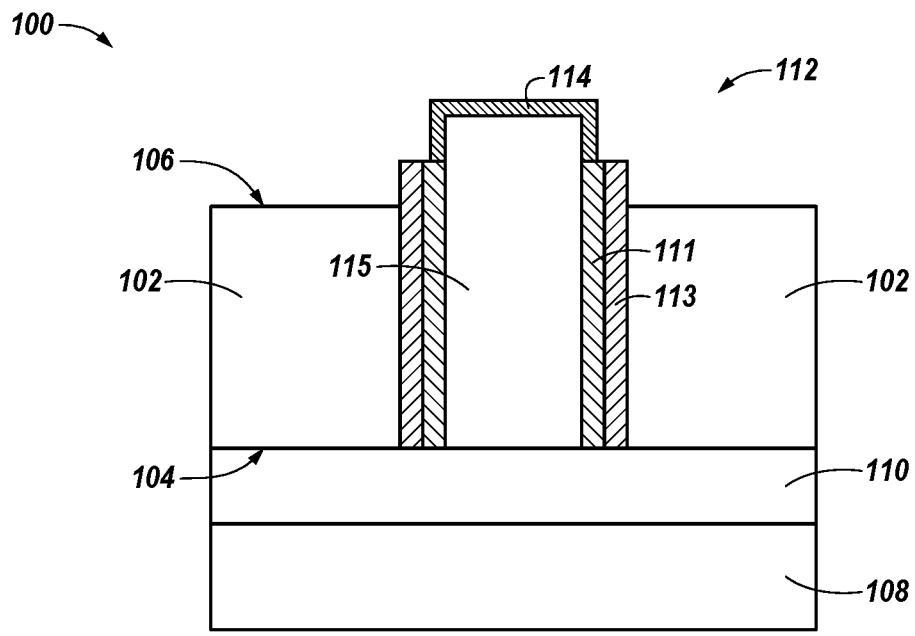

FIG. 1C illustrates the semiconductor device 100 of FIG. 1B at a subsequent processing stage. As illustrated in FIG. 1C, a coating material 114 is formed on the exposed portion of the core material 115. Herein, "formed on" may refer to two materials in contact with one another, or two materials having a number of other materials there between. The coating material 114 can selectively form a coating on the core material 115, e.g., while a coating is not formed on either the barrier material 111 or the dielectric material 113. In other words, the coating material 114 will selectively coat the core material 115. For instance, the coating material 114 may include functional groups, such as azoles, that have a high affinity for the core material 115. As such, the coating material 114 may chemisorb on the core material 115, e.g. an exposed copper surface. Thus the coating material 114 is selective to the core material 115. Some embodiments of the present disclosure provide that the coating material 114 is an organic solder protectant (OSP) material. Examples of the coating material 114, e.g., OSPs, include CUPROTEC™ BP, available from the Dow Chemical Company and ENTEC® 106A, available from Enthone, among others.

The coating material 114 can have decomposition temperature in a range of about 100° C. to about 350° C. As discussed further herein, employing a coating material 114 that has a decomposition temperature of about 100° C. to about 350° C. can provide that the coating material 114 degrades, e.g., decomposes and/or is removed, at a subsequent processing stage that utilizes the decomposition temperature.

Figure 1D:
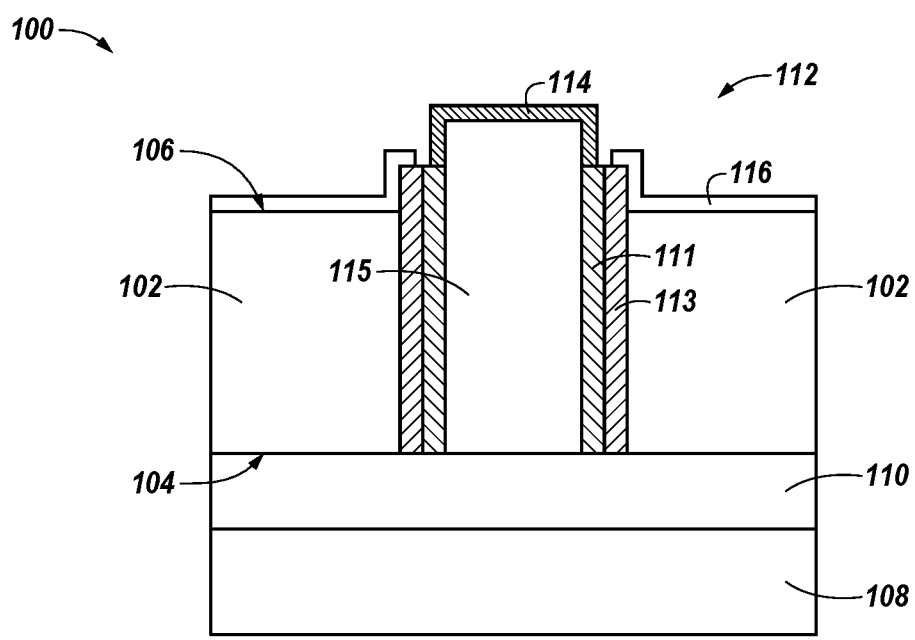

FIG. 1D illustrates the semiconductor device 100 of FIG. 1C at a subsequent processing stage. As illustrated in FIG. 1D, a coupling material 116 is formed on the semiconductor device 100. For example, a coupling material 116 can be formed on a portion of the substrate 102, e.g., on a portion of the second face 106 and a portion of the dielectric material 113. Various embodiments of the present disclosure provide that the coupling material 116 does not interact, e.g., is inert with, with the coating material 114. In other words, the coupling material 116 will not form a coat on the coating material 114.

Various embodiments of the present disclosure provide that the coupling material 116 is a silane coupling material, e.g., an organofunctional silane. For example, the coupling material 116 can be formed from a compound represented by a formula: $(XO)_3Si(CH_2)_nY$, wherein XO is a hydrolyzable alkoxy group, n is an integer from 1 to 10, and Y is an organofunctional group. Examples of the organofunctional group include amine groups, mercapto groups, epoxy groups, and vinyl groups, for instance. A commercially available example of the coupling material 116 is AP-930, available from Asahi Glass Co., Ltd., among others.

Figure 1E:
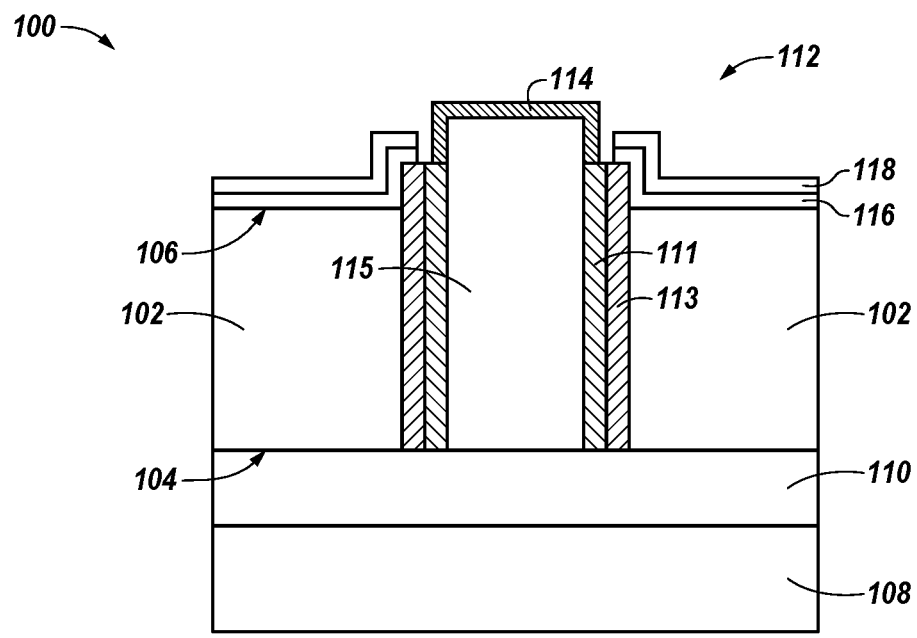

FIG. 1E illustrates the semiconductor device 100 of FIG. 1D at a subsequent processing stage. As illustrated in FIG. 1E, a spin on dielectric material 118 is formed on the coupling material 116. Embodiments of the present disclosure provide that the spin on dielectric material 118 does not interact with the coating material 114. In other words, the spin on dielectric material 118 will not form a coat on the coating material 114.

Figure 1F:
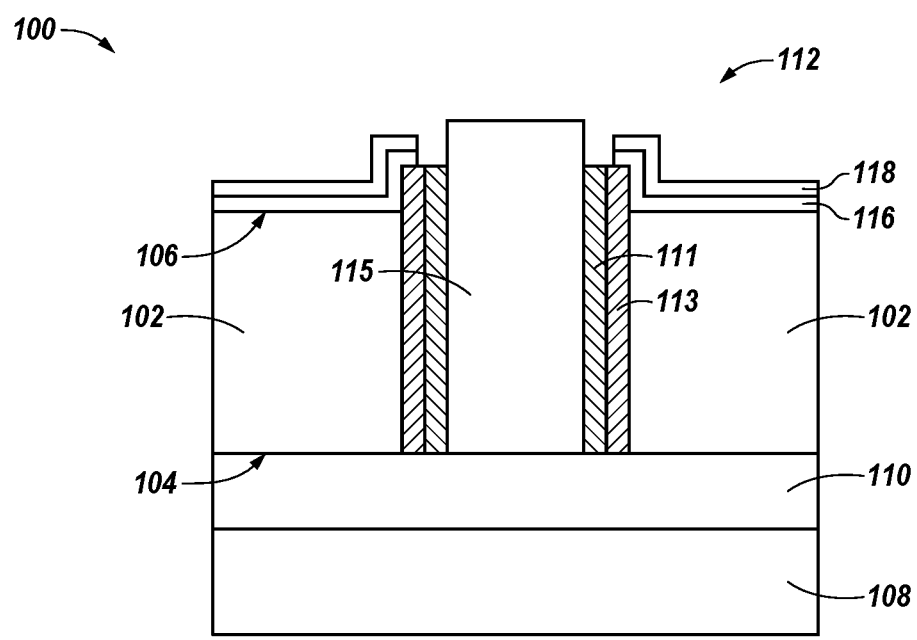

FIG. 1F illustrates the semiconductor device 100 of FIG. 1E at a subsequent processing stage. As illustrated in FIG. 1F, the spin on dielectric material 118 has been cured, e.g., at a curing temperature that is equal to or greater than the decomposition temperature of the coating material 114. As such, curing the spin on dielectric material 118 can provide that the coating material 114 degrades, e.g., decomposes and/or is removed, to expose a portion of the core material 115. Accordingly, the degraded coating material is absent from FIG. 1F.

Various embodiments of the present disclosure provide that a cleaning process may be performed subsequent to curing the spin on dielectric material 118. For example, an oxide may be formed on the core material 115, e.g., due to curing the spin on dielectric material 118 and/or degrading the coating material 114. The cleaning process may be utilized to remove an oxide formed on the core material 115, for instance.

Figure 1G:
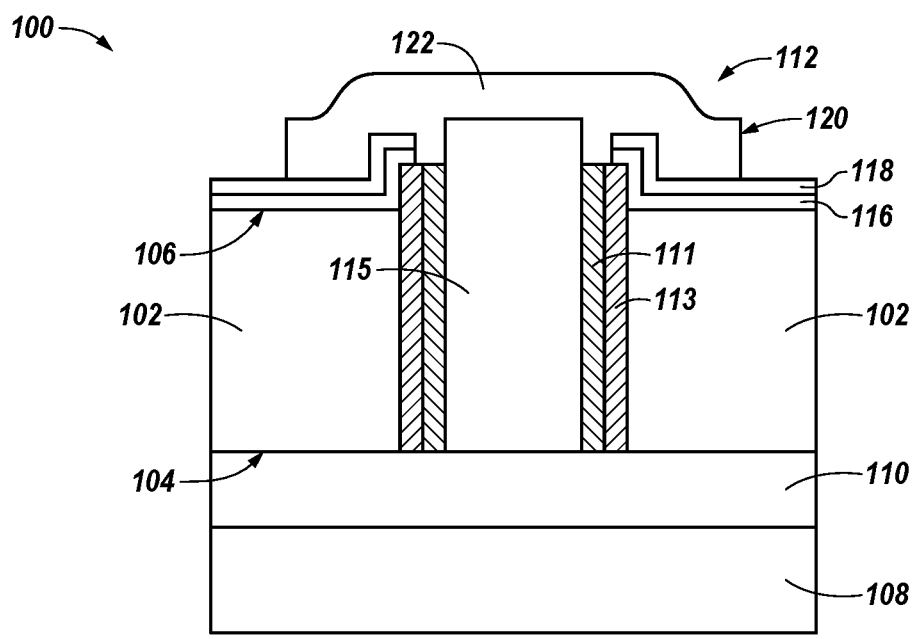

FIG. 1G illustrates the semiconductor device 100 of FIG. 1F at a subsequent processing stage. As illustrated in FIG. 1G, an interconnect 120 can be formed on the semiconductor device 100. For instance, the interconnect 120 can be formed on at least a portion the spin on dielectric material 118 and an exposed portion of the TSV 112, e.g., a portion of the TSV 112 having the barrier material 111 and dielectric material 113 removed therefrom. For various applications, the interconnect 120 can be a UBM or a pillar, for example. The interconnect 120 can be formed by a plating process, for example, and can comprise a number of conductive materials, e.g., metals, such as chromium, copper, titanium, nickel, tungsten, and gold, and/or combinations thereof. As illustrated in FIG. 1G, for various embodiments the interconnect 120 can include a convex portion 122 relative to the TSV 112. The convex portion 122 can result from the interconnect 120 being formed a number of portions of the semiconductor device 100 that are not planar with the second face 106, such as a portion of the core material 115, a portion of the barrier material 111, a portion of the dielectric material 113, a portion of the coupling material 116, and/or a portion of the spin on dielectric material 118, for instance.

Forming the interconnect 120 can include a number of processing stages known to those skilled in the art, which are not illustrated herein. For example, forming the interconnect 120 can include forming a seed material on a portion of the semiconductor device 100. Thereafter, a resist coat can be applied to a portion of the semiconductor device 100. Thereafter, a portion of the TSV 112 can be exposed for plating the interconnect 120. The resist coat can be removed, e.g., stripped, and a portion of the seed material can be removed.

Among other benefits, utilizing the methods, as discussed herein, can provide that the semiconductor devices disclosed herein can be formed without performing an etch process subsequent to exposing the portion of the conductive core material 115 by removing the portion of the dielectric material 113 and the portion of the barrier material 111. Additionally, utilizing the methods, as discussed herein, can provide that the semiconductor devices disclosed herein can be formed without performing a chemical vapor deposition process subsequent to exposing the portion of the conductive core material 115 by removing the portion of the dielectric material 113 and the portion of the barrier material 111.

Figure 2A:
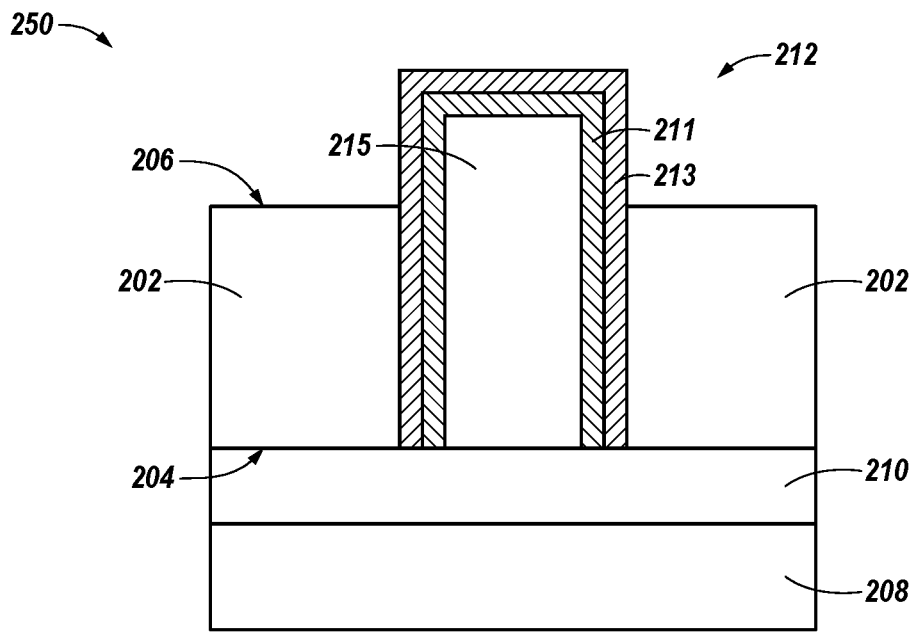
FIGS. 2A-2F illustrate various process stages associated with forming a semiconductor device in accordance with a number of embodiments of the present disclosure.

FIGS. 2A-2F illustrate various process stages associated with forming a semiconductor device in accordance with a number of embodiments of the present disclosure. FIG. 2A illustrates a cross-sectional view of a portion of a semiconductor device 250 in accordance with a number of embodiments of the present disclosure. While FIG. 2A illustrates a single TSV 212, embodiments of the present disclosure are not so limited. For instance, the semiconductor device 250 can include a plurality of TSVs arranged in an array.

As illustrated in FIG. 2A, the TSV 212 extends through the substrate 202, e.g., from the first face 204 to a second face 206, which can be referred to as a backside of the substrate 202. FIG. 2A illustrates device 250 subsequent to a reveal process in which a portion of the substrate material 202 has been removed, e.g., via an etch process, to expose a portion of TSV 212. While FIG. 2A illustrates a single TSV 212, embodiments of the present disclosure are not so limited. For instance, the semiconductor device 250 can include a plurality of TSVs formed in substrate material 202 and arranged in an array configuration, for example.

Figure 2B:
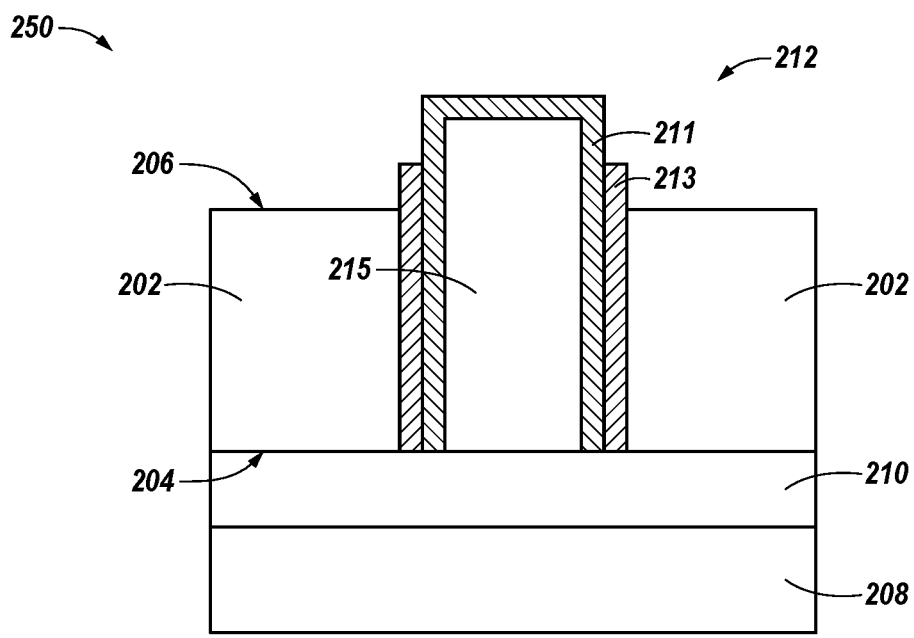

FIG. 2B illustrates the semiconductor device 250 of FIG. 2A at a subsequent processing stage. As illustrated in FIG. 2B, a portion of the dielectric material 213 has been removed, e.g., by an etch process, from the exposed portion of the TSV 212. Removing the portion of the dielectric material 213 can expose a portion of the barrier material 211.

Figure 2C:
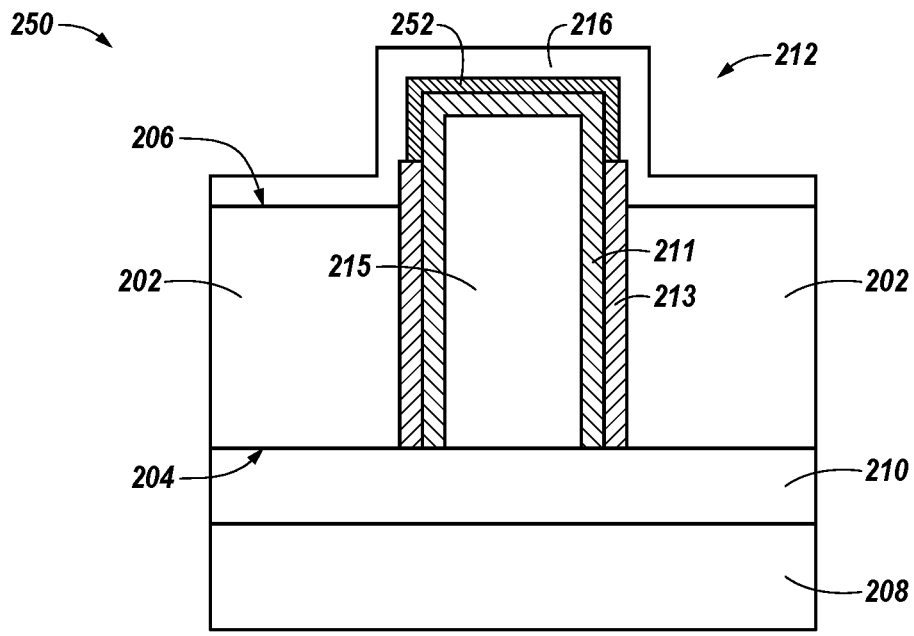

FIG. 2C illustrates the semiconductor device 250 of FIG. 2B at a subsequent processing stage. As illustrated in FIG. 2C, a coupling material 216 is formed on the semiconductor device 250. For example, the coupling material 216 can be formed on a portion of the substrate 202, e.g. on the second face 206, on a portion of the barrier material 211, and on a portion of the dielectric material 213.

The coupling material 216 can be cured, e.g., subjected to a heating process such as a bake process. Curing the coupling material 216 can provide that a barrier material oxide 252 is formed on the exposed portion of the barrier material 211, e.g., due to a temperature associated with the curing. For instance, the curing can occur at a temperature of about 100° C. to about 350° C. Various embodiments of the present disclosure provide the barrier material oxide 252 has a Pilling Bedworth ratio greater than 2.00. For instance, some embodiments of the present disclosure provide that the barrier material oxide 252, such as tantalum oxide, has a Pilling Bedworth ratio of about 2.47, e.g., when the barrier material 211 is tantalum. Having a Pilling Bedworth ratio greater than 2.00 can indicate that a material exhibits a degree of instability, e.g., the material has a flaky characteristic.

Figure 2D:
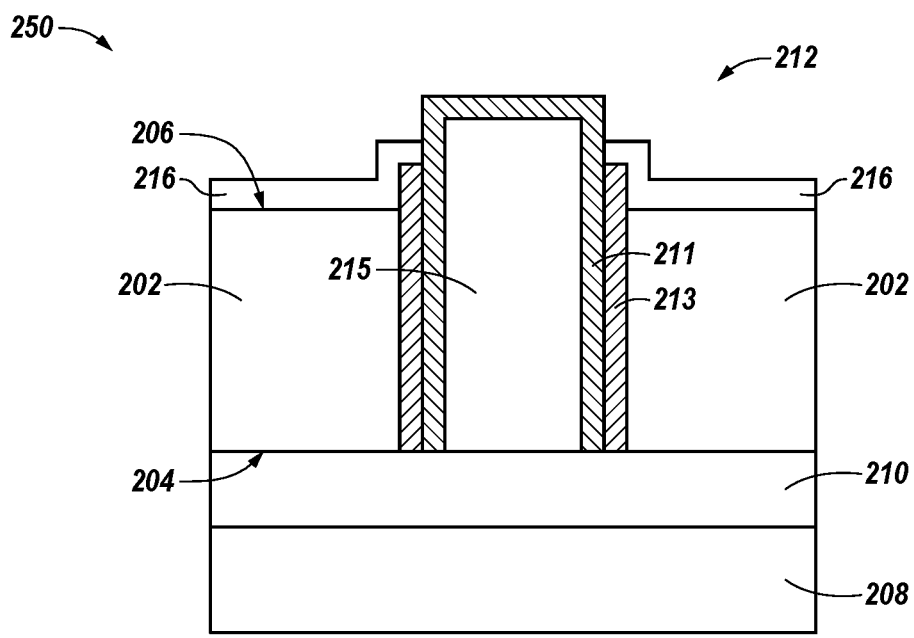

FIG. 2D illustrates the semiconductor device 250 of FIG. 2C at a subsequent processing stage. As illustrated in FIG. 2D, the coupling material 216 that was formed on the barrier material 211 has been removed. Additionally, the barrier material oxide 252 has been removed. Removing the coupling material 216 that was formed on the barrier material 211 and the barrier material oxide 252 can be performed by utilizing an acid, such as hydrofluoric acid, among others. The acid can penetrate through the coupling material 216 formed on the barrier material oxide 252, for instance, due to the presence of tantalum-oxygen-silicon bonds. However, the acid does not penetrate the coupling material 216 formed on other portions of the semiconductor device 250, e.g., portions of the coupling material 216 lacking tantalum-oxygen-silicon bonds. Because the acid can penetrate through the coupling material 216 formed on the barrier material oxide 252, the barrier material oxide 252 can be removed, e.g., etched, thus removing both the barrier material oxide 252 and the coupling material 216. Removing the barrier material oxide 252 as well as the coupling material 216 can expose a portion of the barrier material 211. Thereafter, the acid can be neutralized, by a base such as sodium hydroxide or potassium hydroxide, for instance.

Figure 2E:
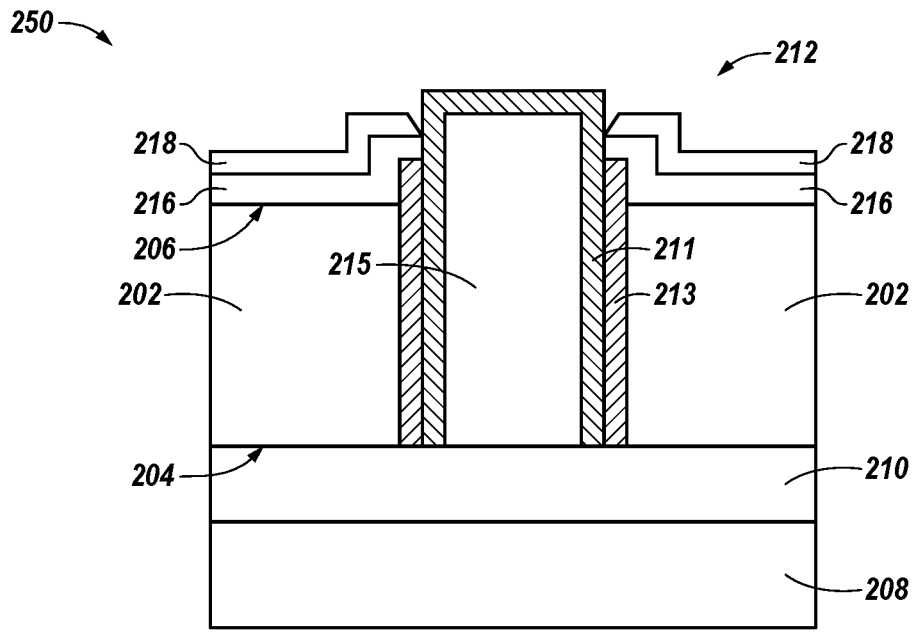

FIG. 2E illustrates the semiconductor device 250 of FIG. 2D at a subsequent processing stage. As illustrated in FIG. 2E, a spin on dielectric material 218 is formed on the coupling material 216.

Figure 2F:
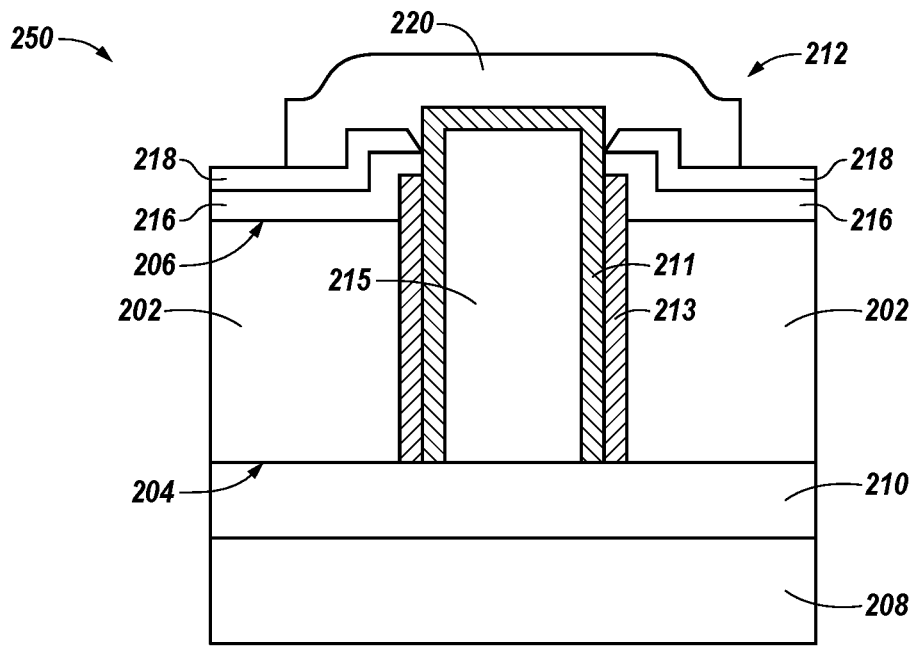

FIG. 2F illustrates the semiconductor device 250 of FIG. 2E at a subsequent processing stage. As illustrated in FIG. 2F, an interconnect 220 can be formed on the semiconductor device 250, e.g., the interconnect 220 can be formed on a portion of the spin on dielectric material 218 and the TSV 212. For various applications, the interconnect 220 can be a UBM or a pillar, for example. As illustrated in FIG. 2F, the interconnect 220 is formed on the exposed portion of the barrier material 211.

Among other benefits, utilizing the methods disclosed herein can provide that the semiconductor devices disclosed herein can be formed without CVD, etching of a silicon nitride layer, and/or CMP stages after a TSV has been exposed by a reveal process are not employed. As such, the semiconductor devices disclosed herein can be produced with an improved, e.g., reduced, cycle time and and/or at a lower cost as compared to previous semiconductor devices, for example.

Figure 3:
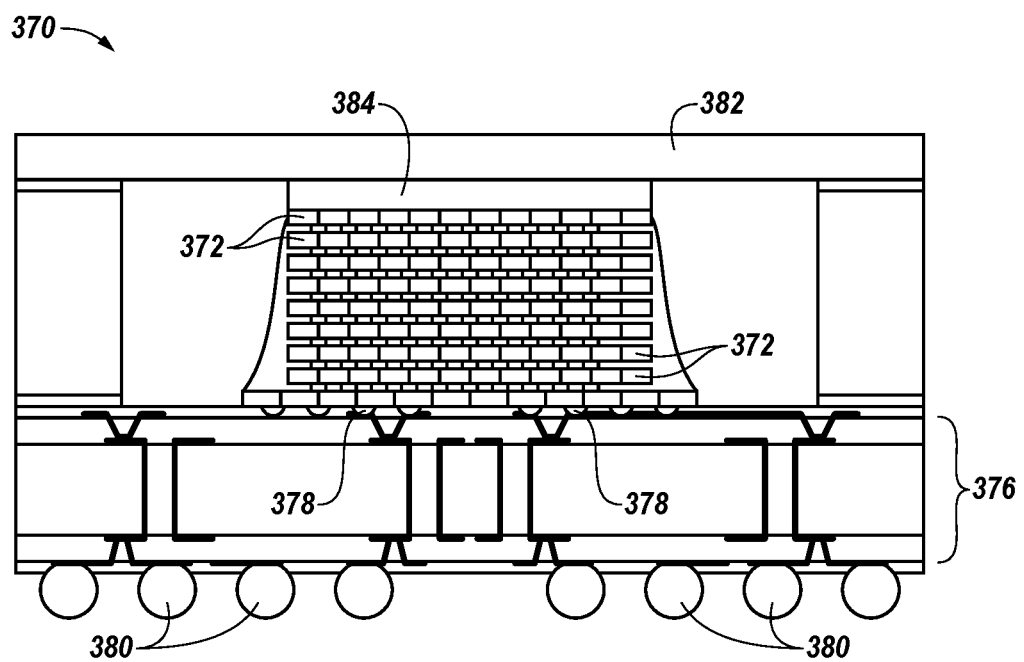
FIG. 3 illustrates a portion of a system in accordance with a number of embodiments of the present disclosure.

FIG. 3 illustrates a portion of a system 370 in accordance with a number of embodiments of the present disclosure. The system 370 can include a number of semiconductor devices 372. The number semiconductor devices 372 may include a number of the semiconductor devices discussed herein, e.g., semiconductor devices 100 and/or semiconductor devices 250. As known to those skilled in the art, the number semiconductor devices 372 may include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, for example, the system 370 can be configured as a hybrid memory cube (HMC) in which the stacked semiconductor devices 372 are DRAM dies or other memory dies that provide data storage.

As illustrated in FIG. 3, the number semiconductor devices 372 can be interconnected, e.g., stacked and electrically coupled, through a number of conductive vias, e.g., TSVs, as discussed herein, to one another and/or other components of the system 370, for example. The number semiconductor devices 372 may be stacked over a semiconductor logic die 374. The semiconductor logic die 374 may be a processor, such as an application specific integrated circuit (ASIC) processor or a central processing unit (CPU) processor.

The number semiconductor devices 372 may be electrically coupled to the semiconductor logic die 374 by a number of TSVs, for example. The semiconductor logic die 374 may be electrically coupled to a printed circuit board (PCB) 376 through, for example, a number of conductive structures 378. The PCB 376 may include a number of conductive structures 380 for electrically coupling the PCB 376 to a higher level substrate, such as a mother board, for example.

The system 370 may include a heat sink 382, e.g., a conductive plate may be positioned over the stack of semiconductor devices 372 to draw heat away from the semiconductor devices 372 and/or the semiconductor logic die 374. A thermal interface material (TIM) 384 may be utilized to improve heat transfer, for instance.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a semiconductor device, the method comprising:
    forming a conductive via in a substrate material, the conductive via comprising a conductive core material, a conductive barrier material formed on the conductive core material, and a first dielectric material formed on the conductive barrier material;
    performing a reveal process to expose a portion of the first dielectric material;
    removing a portion of the exposed portion of the first dielectric material such that a portion of the conductive barrier material is exposed;
    forming a barrier material oxide on the exposed portion of the conductive barrier material by forming a silane coupling material on the exposed portion of the conductive barrier material, wherein the silane coupling material is also formed on at least a portion of the substrate material;
    removing the barrier material oxide and the silane coupling material formed on the exposed portion of the conductive barrier material;
    forming a second dielectric material on the silane coupling material formed on the at least a portion of the substrate material after removing the silane coupling material; and
    forming an interconnect on the exposed portion of the conductive barrier material and on at least a portion of the second dielectric material.

2. The method of claim 1, including performing a bake process subsequent to forming the silane coupling material on the exposed portion of the conductive barrier material.

3. The method of claim 1, wherein the conductive barrier material is a metal and the barrier material oxide is a metal oxide.

4. The method of claim 1, wherein the second dielectric material is a spin on dielectric material.

5. The method of claim 1, including removing the silane coupling material and the barrier material oxide via a hydrofluoric acid.

6. The method of claim 1, further comprising not performing a chemical mechanical planarization process subsequent to performing the reveal process.

7. The method of claim 1, wherein forming the barrier material oxide comprises forming a barrier material oxide having a Pilling Bedworth ratio of at least 2.0.

8. The method of claim 7, wherein the conductive barrier material comprises tantalum, and wherein the barrier material oxide comprises tantalum oxide.

9. A method of forming a semiconductor device, the method comprising:
- forming a conductive via in a substrate material, the conductive via comprising a conductive core material, a conductive barrier material formed on the conductive core material, and a first dielectric material formed on the conductive barrier material;
- performing a reveal process to expose a portion of the first dielectric material;
- performing an etch to remove a portion of the exposed portion of the first dielectric material to expose a portion of the conductive barrier material;
- depositing a coupling material on a surface of the substrate material and on the exposed portion of the conductive barrier material;
- performing a curing process on the coupling material to form a barrier material oxide on the exposed portion of the conductive barrier material;
- performing a wet etch process to remove the barrier material oxide and the coupling material formed on the exposed portion of the barrier material, wherein the cured coupling material remains on the surface of the substrate material subsequent to the wet etch process;
- forming a second dielectric material on the cured coupling material remaining on the surface of the substrate material; and
- forming an interconnect on the exposed portion of the conductive barrier material and on at least a portion of the second dielectric material.

10. The method of claim 9, including performing the curing process at a temperature of 100° C. to 350° C.

11. The method of claim 9, wherein the coupling material is formed from a compound represented by a formula: $(XO)_3Si(CH_2)_nY$, wherein XO is a hydrolyzable alkoxy group, n is an integer from 1 to 10, and Y is an organofunctional group.

12. The method of claim 9, wherein the method includes forming the semiconductor device without performing a chemical vapor deposition process subsequent to performing the reveal process.

13. The method of claim 9, wherein the conductive barrier material comprises tantalum and the conductive core material comprises copper.

* * * * *